(12) United States Patent
Jaumouillé et al.

(10) Patent No.: US 12,021,470 B2
(45) Date of Patent: Jun. 25, 2024

(54) METHOD FOR IDENTIFYING A MALFUNCTION IN AN INVERTER-MOTOR ASSEMBLY

(71) Applicant: Continental Automotive Technologies GmbH, Hannover (DE)

(72) Inventors: Rodolphe Jaumouillé, Toulouse (FR); Michel Parette, Toulouse (FR)

(73) Assignee: Continental Automotive Technologies GmbH (DE)

(*) Notice: Subject to any disclaimer, the term of this patent is extended or adjusted under 35 U.S.C. 154(b) by 148 days.

(21) Appl. No.: 17/797,242

(22) PCT Filed: Dec. 18, 2020

(86) PCT No.: PCT/EP2020/087208
§ 371 (c)(1),
(2) Date: Aug. 3, 2022

(87) PCT Pub. No.: WO2021/155987
PCT Pub. Date: Aug. 12, 2021

(65) Prior Publication Data
US 2023/0068905 A1 Mar. 2, 2023

(30) Foreign Application Priority Data
Feb. 4, 2020 (FR) ...................................... 2001078

(51) Int. Cl.
*H02P 29/024* (2016.01)
*B62D 5/04* (2006.01)
*H02P 27/08* (2006.01)

(52) U.S. Cl.
CPC ............ *H02P 29/024* (2013.01); *H02P 27/08* (2013.01); *B62D 5/0487* (2013.01)

(58) Field of Classification Search
CPC .... H02P 29/02; H02P 29/024; H02P 29/0241; H02P 27/08; H02P 29/028; H02P 29/032;
(Continued)

(56) References Cited

U.S. PATENT DOCUMENTS

2019/0207510 A1    7/2019  Parette

FOREIGN PATENT DOCUMENTS

JP    2009055657 A  *  3/2009   .......... H02P 29/0241
JP    2009055657 A      3/2009
(Continued)

OTHER PUBLICATIONS

Hisanaga Tomomune et al., Controller of Motor, Mar. 12, 2009, Clarivate Analytics, pp. 1-33 (Year: 2009).*
(Continued)

*Primary Examiner* — Antony M Paul
(74) *Attorney, Agent, or Firm* — Buchanan Ingersoll & Rooney PC

(57) ABSTRACT

A method for identifying a malfunction in an inverter-motor assembly, including a plurality of sequential diagnostic procedures each having the following steps: a step of initially configuring the inverter; a step of initially configuring the phase switches; a step of biasing the phases; a voltage measurement step in which the voltage of each phase is measured; a comparison step in which the voltage measurement of each phase is compared with an expected resultant value; and a step of identifying a malfunction when the voltage measurement of a phase differs from the expected resultant value.

15 Claims, 3 Drawing Sheets

(58) Field of Classification Search
CPC ...... H02P 29/60; H02P 29/68; H02P 2101/45;
H02P 27/04; H02P 27/06; H02P 21/22;
H02P 25/022; H02P 25/03; H02P 25/062;
H02P 25/064; H02P 3/12; H02P 3/22;
H02P 1/42; H02P 1/46; B60K 6/22; B60L
2240/427; B60L 2240/527; B60L
2210/40; B60R 16/033; B62D 5/0487;
G01R 31/343
See application file for complete search history.

(56) References Cited

FOREIGN PATENT DOCUMENTS

| JP | 2015089294 A | 5/2015 |
|----|--------------|--------|
| WO | 2017178744 A1 | 10/2017 |

OTHER PUBLICATIONS

International Search Report and Written Opinion for International Application No. PCT/EP2020/087208, dated Feb. 17, 2021, with partial English translation, 9 pages.

International Search Report and Written Opinion for International Application No. PCT/EP2020/087208, dated Feb. 17, 2021, 13 pages (French).

* cited by examiner

METHOD FOR IDENTIFYING A MALFUNCTION IN AN INVERTER-MOTOR ASSEMBLY

CROSS REFERENCE TO RELATED APPLICATIONS

This application is the U.S. National Phase Application of PCT International Application No. PCT/EP2020/087208, filed Dec. 18, 2020, which claims priority to French Patent Application No. 2001078, filed Feb. 4, 2020, the contents of such applications being incorporated by reference herein.

FIELD OF THE INVENTION

The invention relates to the field of controlling and monitoring multiphase electric motors which operate with an inverter.

BACKGROUND OF THE INVENTION

Many applications use electric motors with multiple phases supplied with power by a DC voltage source such as a battery, through an inverter. In motor vehicles, for example, such electric motors are supplied with power by the vehicle's batteries.

In some, particularly critical applications, the operation of these electric motors is monitored with a view first of all to identifying any malfunction, and then to identifying the source of this malfunction in order to apply corrective measures or to switch to an adapted degraded operating mode.

An electric motor controlling the steering of a motor vehicle is an example of one of these particularly critical applications. Indeed, the loss of the steering or assisted-steering function, that is to say for controlling the angular direction of the vehicle's wheels, presents a critical risk, and this criticality is greatest when, for example, the vehicle is an autonomous vehicle.

In these vehicle steering or assisted-steering applications, any malfunction in the inverter-motor assembly must be detected and identified in a very short time in order to be able to take measures appropriate for the identified malfunction before this malfunction has any effect on the driving of the vehicle.

Malfunction detection methods capable, for example in a motor vehicle, of detecting the symptoms of a malfunction in the inverter-motor assembly for a particular application are known.

There are also known palliative methods allowing the implementation of a corrective solution or a degraded operating mode allowing the function of the electric motor to continue to be carried out in safety. For example, when one of the phases of an electric power-steering motor is defective, motor control can be adapted to operate only with two of the phases of the three-phase motor, in degraded mode, thereby allowing power steering to be maintained while waiting for maintenance.

To implement such a palliative method in response to the detection of a malfunction, it is necessary to identify this malfunction, that is to say to identify precisely which electrical or mechanical member is faulty within the inverter-motor assembly. These methods for identifying a malfunction are particularly difficult to implement and it is on them that the correct implementation of palliative methods depends.

Such methods are known for identifying malfunctions in an inverter-motor assembly which use diagnostic algorithms to identify the type of failure and to discern which phase of the motor is faulty. Discerning which phase of the motor is faulty is based on an inverse digital model of the motor, which uses the voltage and current measurements taken on the motor before the occurrence of the fault. The performance of these algorithms is highly dependent on the precision of the motor parameters (resistance, inductance, motor flux). However, these parameters change according to many external factors such as temperature or current saturation. These algorithms must therefore be supplemented with advanced and sufficiently precise thermal models of the various members of the motor, with redundant temperature sensors, and with precise calibrations of the motor parameters. These known methods lead to diagnostic complexity in order to cover the entire operating range, for example, of a motor vehicle member such as power steering: high and low temperature, high speed, high torque, voltage or speed gradient, etc. These methods also require significant computing resources to run these advanced algorithms.

Other known methods for identifying malfunctions use hardware components intended to drive the power stage of the electric motor control. On detecting a hardware malfunction, such a component is capable of diagnosing which phase of the electric motor is faulty by continuously monitoring the power stage and/or in a diagnosis carried out after the electric motor has been deactivated. These methods are generally based on the injection of a weak current flowing between phases of the electric motor. Such methods require the presence of an expensive component and physically encumber the printed circuits intended for controlling the electric motor. Moreover, it is not acceptable in certain applications, such as motor vehicle power steering, to generate a current in the motor to carry out a diagnosis. Furthermore, a supervisory hardware component may be sensitive to the speed of the motor because the voltages in the phases of the motor may experience interference from the counter-electromotive force brought about by the speed of the electric motor.

SUMMARY OF THE INVENTION

The aim of an aspect of the invention is to improve the methods of the prior art for identifying a malfunction in an inverter-motor assembly.

To that end, an aspect of the invention relates to a method for identifying a malfunction in a multiphase inverter-motor assembly comprising an electric motor and an inverter having power switches distributed across branches, each phase of the electric motor being connected to a branch of the inverter by a phase switch, this method comprising a plurality of sequential diagnostic procedures each comprising the following steps:

- a step of initially configuring the inverter in which a control choice is made for each branch of the inverter, this choice being made from among the group consisting of: open-mode fixed control of the power switches; pulse-width modulation control according to a predetermined diagnostic duty cycle of the power switches;
- a step of initially configuring the phase switches in which a choice of state is made for each phase switch, this choice being made between a closed state and an open state;
- a step of biasing the phases in which a predetermined diagnostic voltage is applied to each of the branches of the inverter;

a voltage measurement step in which the voltage of each phase is measured;

a comparison step in which the voltage measurement of each phase is compared with an expected resultant value, and a step of identifying a malfunction when the voltage measurement of a phase differs from the expected resultant value.

Such a method for identifying a malfunction makes it possible to discern the origin of a failure in a very short time following the detection of this failure. The method according to an aspect of the invention is particularly suited to automotive standards and allows, for example, a malfunction to be identified within 100 ms following the occurrence of the malfunction over the entire speed range of a power-steering motor.

The method according to an aspect of the invention does not require precise knowledge of the parameters of the motor. Calibration of these parameters in production, or knowledge of their change with temperature and current, is therefore not necessary. Moreover, in operation, no temperature measurement within the electric motor or other members is necessary.

In addition, the method according to an aspect of the invention has low sensitivity to interference relating to large torque, speed or voltage gradients (the identification of the malfunction is carried out outside the current motor control phases).

The method is relatively straightforward to implement and requires little in the way of computing resources for the implementation thereof within a computer.

The cost of implementation and the space taken up on a printed circuit board are limited (only two transistors and a few resistors are required, in one embodiment).

The method is not intrusive, which ensures operating safety (no current injection is carried out on the power stage).

The method for identifying a malfunction may comprise the following additional features, alone or in combination:
- in the step of biasing the phases, the predetermined diagnostic voltage is substantially 50% of the supply voltage of the inverter;
- the voltage measurement step is carried out by determining the average of a plurality of voltage measurement samples taken for each phase;
- the method comprises a first sequential diagnostic procedure in which:
  - all of the power switches are open-mode controlled in the step of initially configuring the inverter;
  - all of the phase switches are positioned in the open state in the step of initially configuring the phase switches;
  - in the step of biasing the phases, the predetermined diagnostic voltage is substantially 50% of the supply voltage of the inverter;
  - in the comparison step, the expected resultant value for each phase is substantially equal to the predetermined diagnostic voltage;
  - in the step of identifying a malfunction, when the voltage measurement of a phase is substantially equal to the supply voltage of the inverter, a short circuit is identified on the power switch on the high side of the corresponding phase,
  - in the step of identifying a malfunction, when the voltage measurement of a phase is substantially equal to zero, a short circuit is identified on the low-side power switch of the corresponding phase;
- the method comprises a second sequential diagnostic procedure in which:
  - in the step of initially configuring the inverter, all of the power switches are open-mode controlled with the exception of the power switches corresponding to a phase being tested which are pulse-width modulation controlled according to a predetermined diagnostic duty cycle;
  - all of the phase switches are positioned in the open state in the step of initially configuring the phase switches;
  - in the step of biasing the phases, the predetermined diagnostic voltage is substantially 50% of the supply voltage of the inverter;
  - in the comparison step, the expected resultant value for the phase being tested is a value substantially equal to the supply voltage of the inverter multiplied by the predetermined diagnostic duty cycle, and the expected resultant value for the other phases is substantially equal to the predetermined diagnostic voltage,
- according to a first part of the second sequential diagnostic procedure:
  - in the step of initially configuring the inverter, the predetermined diagnostic duty cycle is much lower than 50%;
  - in the step of identifying a malfunction, when the voltage measurement of a phase which is being tested is substantially equal to the voltage of another phase which is not being tested, a short circuit is identified between these two phases;
  - when the voltage measurement of the phase being tested is higher than the predetermined diagnostic voltage, a malfunction is identified in the control of the low-side power switch of the phase being tested;
- according to a second part of the second sequential diagnostic procedure:
  - in the step of initially configuring the inverter, the predetermined diagnostic duty cycle is much higher than 50%;
  - in the step of identifying a malfunction, when the voltage measurement of the phase being tested is lower than the predetermined diagnostic voltage, a malfunction is identified in the control of the high-side power switch of the phase being tested;
- the method comprises a third sequential diagnostic procedure in which:
  - in the step of initially configuring the inverter, all of the power switches are open-mode controlled;
  - all of the phase switches are positioned in the closed state in the step of initially configuring the phase switches;
  - in the step of biasing the phases, the predetermined diagnostic voltage is substantially 50% of the supply voltage of the inverter;
  - in the voltage measurement step, the average of the voltages of all of the phases is determined;
  - in the comparison step, the expected resultant value for the average of the voltages of all of the phases is substantially equal to the predetermined diagnostic voltage;
  - in the step of identifying a malfunction, when the average of the voltages of all of the phases is lower than the predetermined diagnostic voltage, a short circuit is identified between at least one phase and ground, this short circuit being located between the phase switches and the motor;

in the step of identifying a malfunction, when the average of the voltages of all of the phases is higher than the predetermined diagnostic voltage, a short circuit is identified between at least one phase and the supply voltage of the inverter, this short circuit being located between the phase switches and the motor;

the method comprises a first variant of a fourth sequential diagnostic procedure in which:

in the step of initially configuring the inverter, all of the power switches are open-mode controlled with the exception of the power switches corresponding to a phase being tested which are pulse-width modulation controlled according to a predetermined diagnostic duty cycle;

all of the phase switches are positioned in the closed state in the step of initially configuring the phase switches;

in the step of biasing the phases, the predetermined diagnostic voltage is substantially 50% of the supply voltage of the inverter;

in the comparison step, the expected resultant value for the phase being tested is substantially equal to the value of the supply voltage of the inverter multiplied by the predetermined diagnostic duty cycle, and the expected resultant value for the other phases is substantially equal to the voltage of the phase being tested plus the voltage resulting from the counter-electromotive force of the motor for the phase in question;

in the step of identifying a malfunction, when the voltage of the phase being tested is substantially equal to the value of the supply voltage of the inverter multiplied by the predetermined diagnostic duty cycle, and when the voltages of the other phases are substantially equal to the predetermined diagnostic voltage plus the counter-electromotive force of the phase in question, an interruption is identified on the phase being tested, between the phase switches and the motor;

the method comprises a second variant of the fourth sequential diagnostic procedure in which:

in the step of initially configuring the inverter, all of the power switches are open-mode controlled;

all of the phase switches are positioned in the closed state in the step of initially configuring the phase switches;

in the step of biasing the phases, the predetermined diagnostic voltage is substantially 50% of the supply voltage of the inverter;

in the comparison step, the expected resultant value for each phase is substantially equal to the predetermined diagnostic voltage plus the counter-electromotive force of the phase in question, the addition of the counter-electromotive forces of all of the phases being equal to zero;

in the step of identifying a malfunction, when the voltage of a first phase is substantially equal to the predetermined diagnostic voltage and the sum of the counter-electromotive forces of the other phases is equal to zero, an interruption is identified on this first phase, between the phase switches and the motor;

the method comprises a second variant of the fourth sequential diagnostic procedure in which:

in the step of initially configuring the inverter, all of the power switches are open-mode controlled;

all of the phase switches are positioned in the closed state in the step of initially configuring the phase switches;

in the step of biasing the phases, the predetermined diagnostic voltage is substantially 50% of the supply voltage of the inverter;

in the measurement step, the voltage measurements are carried out according to a sampling comprising a predetermined number of measurements;

in the comparison step, the expected resultant value for each phase is substantially equal to the predetermined diagnostic voltage plus the counter-electromotive force of the phase in question, the addition of the counter-electromotive forces of all of the phases being equal to zero;

in the step of identifying a malfunction, when the voltage of a first phase is substantially equal to the predetermined diagnostic voltage and the sum of the counter-electromotive forces of the other phases is equal to zero, an error is qualified for this first phase;

when the number of qualified errors exceeds an identification threshold, an interruption is identified on this first phase, between the phase switches and the motor.

the first variant of the fourth sequential diagnostic procedure is implemented for an electrical rotational speed below approximately 200 rad/s and the second variant of the fourth sequential diagnostic procedure is implemented for an electrical rotational speed above approximately 200 rad/s.

BRIEF DESCRIPTION OF THE DRAWINGS

Other features and advantages of aspects of the invention will become apparent from the following non-limiting description, with reference to the appended drawings, in which.

DETAILED DESCRIPTION OF THE PREFERRED EMBODIMENTS

Figure 1:
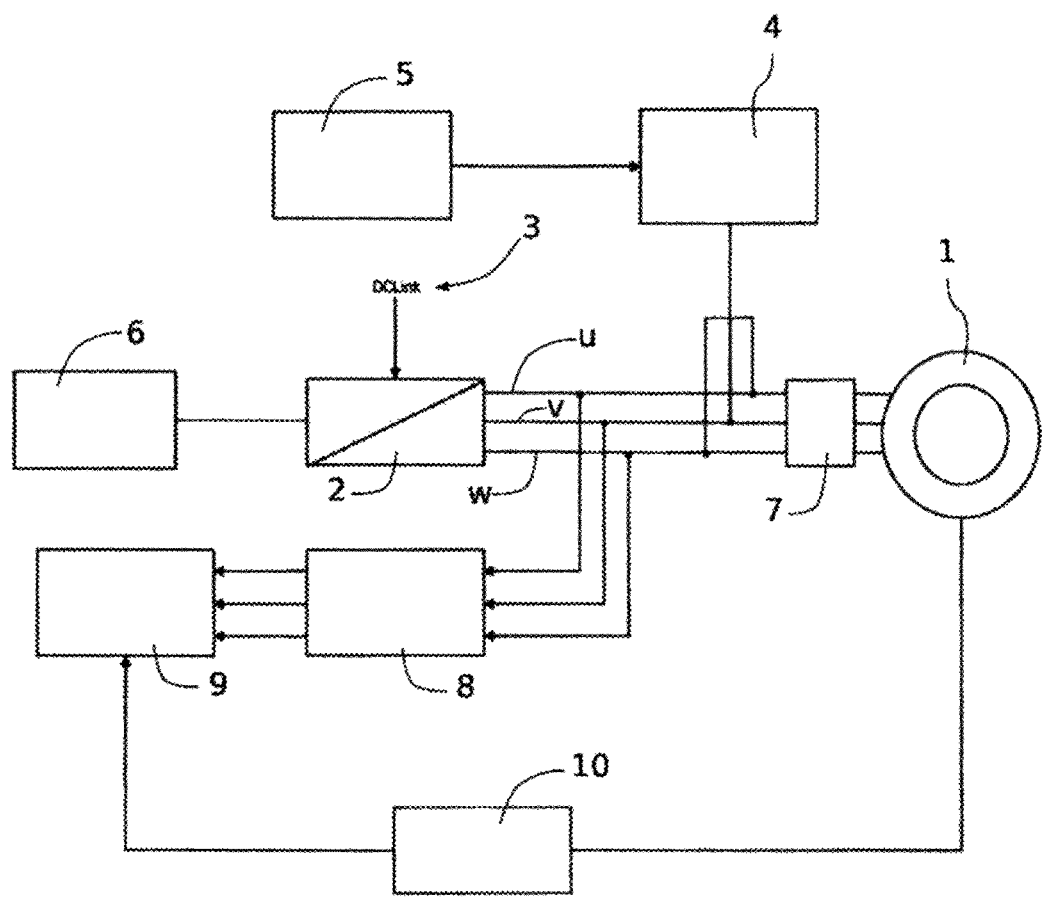
FIG. 1 schematically shows an inverter-motor assembly adapted to implement the method according to an aspect of the invention.

FIG. 1 schematically shows an inverter-motor assembly and the elements allowing the implementation of the method for identifying a malfunction according to an aspect of the invention.

The motor-inverter assembly comprises an electric motor 1 supplied with power by an inverter 2 connected to a battery 3. In the present example, the motor 1 is a three-phase electric motor for assisting in or controlling the steering of a vehicle. The motor 1 has three phases u, v, w connecting the motor 1 to the inverter 2. A set of phase switches 7 are provided to allow each of the phases u, v, w to be interrupted.

The inverter 2 consists of power transistors distributed across three branches corresponding to the three phases u, v, w. The inverter 2 is controlled in a conventional manner for this type of application by virtue, for example, of a computer integrating a microcontroller and the other electronic elements for controlling the electric motor (the computer is not shown in the figures). This computer is suitable for implementing malfunction detection methods as well as palliative methods when a malfunction is detected and identified.

The members for controlling such an electric motor as well as the malfunction detection methods and palliative methods are known and will not be described in more detail here.

The present description relates to a method for identifying a malfunction implemented as soon as a malfunction has been detected. To implement this identification method, the inverter-motor assembly comprises a phase-biasing assembly 4 which is designed to apply a predetermined voltage to each of the phases u, v, w. This phase-biasing assembly is associated with a biasing module 5 which is designed to activate or deactivate the biasing of the phases by acting on the phase-biasing assembly 4.

The inverter-motor assembly also comprises a module 6 for configuring the inverter 2. This configuration module 6 allows the operation of the inverter 1 to be controlled according to a predetermined pulse-width modulation signal for each phase u, v, w, or, conversely, allows the inverter 1 to be deactivated.

The inverter-motor assembly further comprises:
- a voltage module 8 allowing the measurement and acquisition of the voltages of each of the phases u, v, w;
- a speed module 10 designed to measure the rotational speed of the motor;
- an identification module 9 for identifying which member of the inverter-motor assembly is responsible for the malfunction based on the elements provided by the voltage module 8 and the speed module 10.

Figure 2:
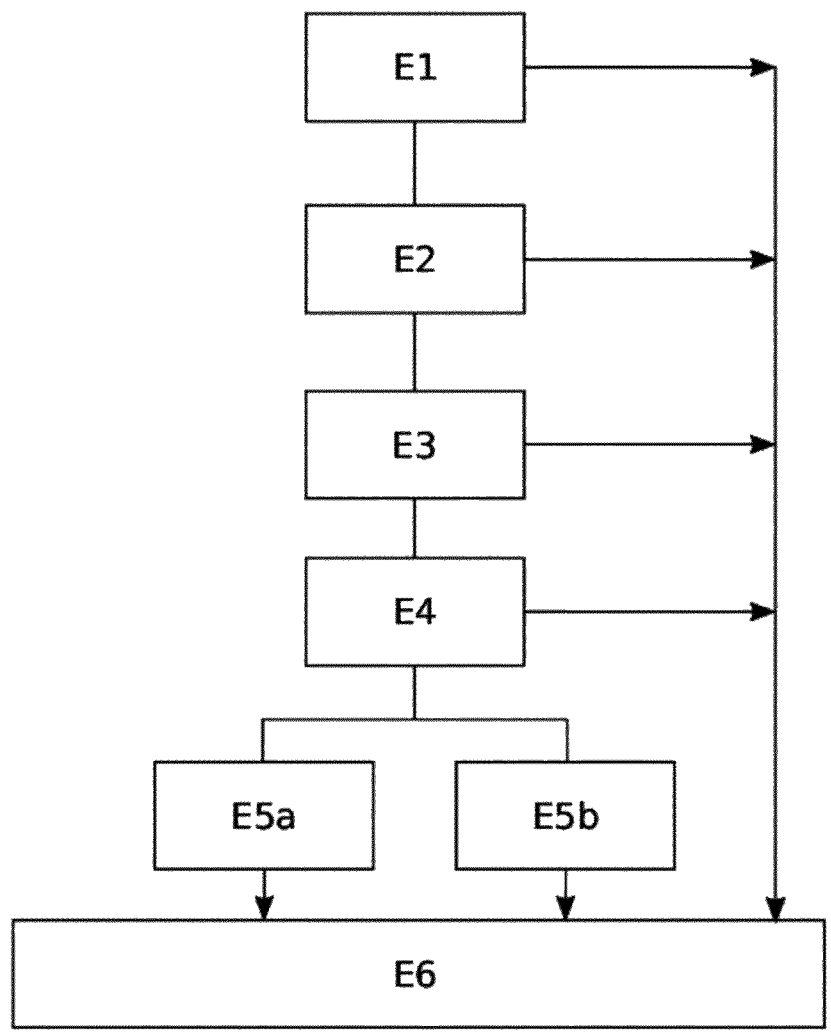
FIG. 2 is a diagram illustrating the method according to an aspect of the invention.

FIG. 2 schematically illustrates the succession of sequential diagnostic procedures constituting the method for identifying a malfunction.

The method for identifying a malfunction sequentially implements a plurality of diagnostic procedures all having the same general structure.

In the present example, each of these sequential diagnostic procedures comprises the following steps in particular:
- the initial configuration of the inverter which is carried out by the configuration module 6;
- the initial configuration of the phase switches 7;
- the activation of the biasing of the phases u, v, w which is carried out by the biasing module 5, according to a predetermined voltage;
- a voltage measurement and acquisition step for each phase, performed by the voltage module 8;
- a comparison step in which the voltage measurements of the phases u, v, w are compared with expected resultant values;
- a step of identifying a malfunction, that is to say identifying which member of the inverter-motor assembly is the cause of the malfunction, by means of the identification module 9.

FIG. 2 illustrates the identification method as the sequence of the various sequential diagnostic procedures, each of which has the general structure presented above, carried out according to a sequence allowing the members of the inverter-motor assembly to be controlled until the one or more members responsible for the malfunction are determined.

In a first step E1, which is prior to the identification method, a malfunction is signaled following the implementation of a conventional malfunction detection method (not described). The malfunction identification method starts from this step E1 which may comprise, for example, the raising of a flag indicating the detection of a malfunction that needs to be identified.

In the present example, the method for identifying a malfunction comprises four sequential diagnostic procedures illustrated by steps E2, E3, E4, as well as E5a and E5b. These four sequential diagnostic procedures are executed in this order and allow, respectively:
- Step E2: identification of a short circuit of one of the power transistors of the inverter;
- Step E3: identification of a short circuit between two phases u, v, w, or identification of a power transistor that is still open, or identification of faulty transistor control;
- Step E4: identification of a short circuit between a phase u, v, w of the motor and ground or between a phase u, v, w and the power supply DCLink;
- Steps E5a and E5b: identification of an interruption in electrical continuity resulting in the permanent opening of one of the phases u, v, w of the motor.

Step E6 corresponds to the raising of a flag identifying a malfunction to allow a conventional palliative method (not described here) to take over in order to apply corrective measures or degraded operation, based on the identification of the malfunction.

Each of these sequential diagnostic procedures will now be described with reference to FIG. 3 which shows the main elements of an inverter-motor assembly 1.

Figure 3:
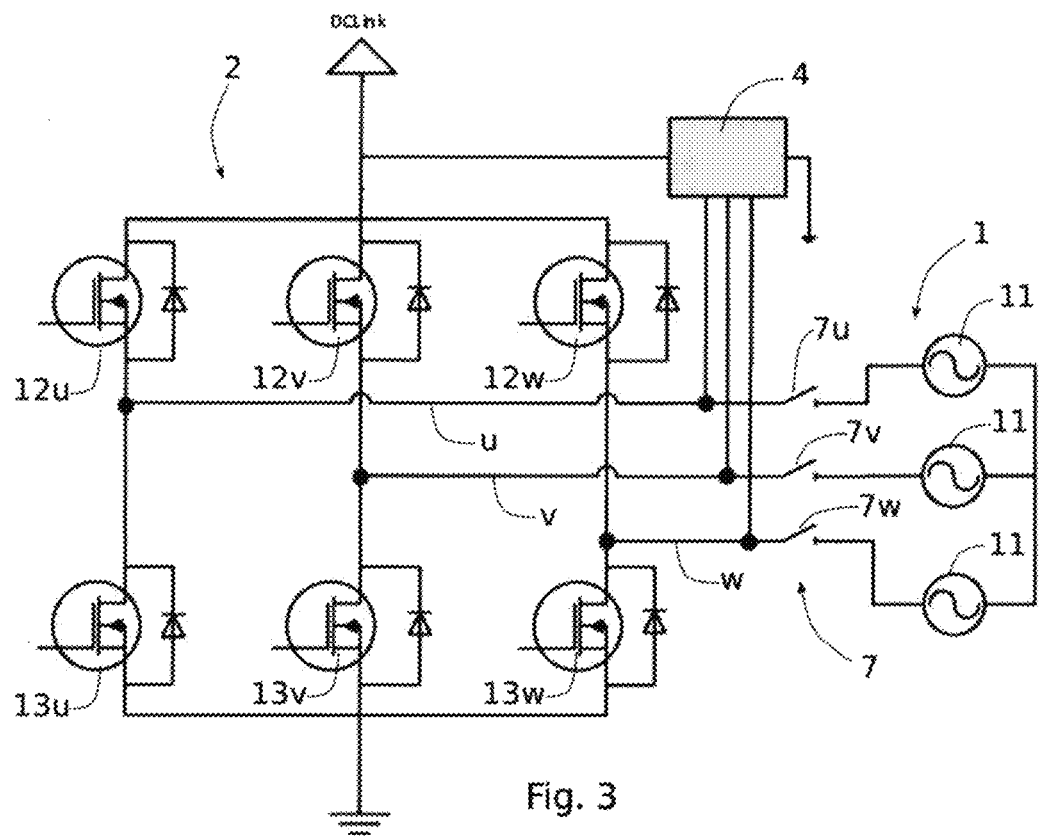
FIG. 3 illustrates the inverter-motor assembly of FIG. 1 in greater detail.

In this FIG. 3, the three-phase electric motor 1 comprises three windings 11. The set of phase switches 7 consists of three switches 7u, 7v, 7w each designed to open one of the phases u, v, w.

The inverter 2 comprises three branches corresponding to the three phases u, v, w, each of the branches comprising two power transistors, for example MOS (metal-oxide-semiconductor) transistors, connected on the one hand to ground and on the other hand to the power supply DCLink. The inverter 2 thus comprises:
- three transistors 12u, 12v, 12w on the high side, that is to say connected to the power supply potential (here the battery voltage DCLink); and
- three transistors 13u, 13v, 13w on the low side, that is to say connected to ground.

Each of the branches of the inverter 2 drives one of the phases u, v, w by virtue of its high transistor 12 and its low transistor 13.

With reference to FIG. 2, when implementing the method for identifying a malfunction, the first sequential diagnostic procedure E2 is first carried in order to identify the presence of a short circuit on one of the transistors 12, 13.

This first diagnostic procedure starts with a first step of initially configuring the inverter which consists here in deactivating the control of the power stage, that is to say all of the transistors 12, 13 are positioned in the passive state (i.e. open) for this first diagnostic procedure.

In a second step of initially configuring the phase switches 7, these phase switches 7 are all open so as not to generate any interference in the motor 1 in the event of a failure in the power stage and so as not to experience the effects the counter-electromotive force brought about by the potential speed of the electric motor which is still rotating (since the diagnostic procedure may be carried out while the motor 1 is rotating).

In a step of biasing the phases, the biasing module 5 controls the biasing circuit 4 so as to bias all of the phases u, v, w with a predetermined diagnostic voltage Vb. The diagnostic voltage Vb is, in this example, 50% of the supply voltage DCLink of the inverter 2.

In a voltage measurement step, the microcontroller acquires the voltage of each phase u, v, w by virtue of the voltage module 8.

In a comparison step, the voltage measurement of each phase u, v, w is compared with an expected resultant value, and In the present example, the expected resultant value is equal to the diagnostic voltage Vb. Specifically, if no transistor 12, 13 is shorted, then the voltages measured for each of the phases u, v, w must be equal to Vb (see FIG. 3) since no connection exists between the phases u, v, w and ground or the supply voltage DCLink.

Conversely, if the voltage measured on one of the phases u, v, w is equal to the supply voltage DCLink, it means that a short circuit is present on the high-side transistor 12 of the phase in question. Specifically, the phase is directly connected to the voltage DCLink if such a short circuit is present. Similarly, if the voltage measured on one of the phases u, v, w is equal to zero, this means that a short circuit is present on the low-side transistor 13 of the phase in question. Specifically, the phase is directly connected to ground if such a short circuit is present.

For example, if transistor 12$u$ is shorted, the voltages measured in the voltage measurement step for phases v and w will be equal to the diagnostic voltage Vb while the voltage measured on phase u will be equal to the supply voltage DCLink. Similarly, if transistor 13$w$ is shorted, the voltages measured in the voltage measurement step for phases u and v will be equal to the diagnostic voltage Vb while the voltage measured on phase w will be equal to zero.

In practice, the voltage measurement step is preferably carried out with a plurality of measurements (for example 20) over a predetermined duration and by determining the average of these measurements to obtain the voltage value sought. The greater the number of these measurements, the more reliable the voltage measurement.

Similarly, the comparison step is preferably carried out by determining:
- whether the voltage measured on a phase is within a range centered on the diagnostic voltage Vb (which here is 50% of the value DCLink) including a margin of error above or below with respect to Vb. This voltage is then considered equal to Vb (no short circuit);
- if the voltage measured on a phase is much higher than the diagnostic voltage Vb (which here is 50% of the value DCLink), or much higher than the voltage Vb range defined above, this measured voltage is then considered to be equal to DCLink (short circuit on the high-side transistor 12); or
- if the voltage measured on a phase is much lower than the diagnostic voltage Vb, or much lower than the voltage Vb range defined above, this measured voltage is then considered to be equal to zero (short circuit on the low-side transistor 13).

This comparison between the voltage measured on the phases u, v, w and the diagnostic voltage Vb is made for each of the phases u, v, w.

On completion of this first diagnostic procedure, if one or more transistors 12, 13 are identified as being shorted, the system raises a flag (in step E6 of FIG. 2) indicating that the malfunction is a short circuit and identifying the transistor in question.

Following this first sequential diagnostic procedure, if no shorted transistor has been identified, a second sequential diagnostic procedure then takes place (step E3 of FIG. 2). This second diagnostic procedure allows the following malfunctions to be identified: a short circuit between two phases u, v, w; a malfunction in the control electronics for a transistor 12, 13; and a transistor stuck in the open state.

This second diagnostic procedure has two parts executed sequentially. The first part makes it possible to diagnose an anomaly in the control of the low-side transistors 13 or a short circuit between two phases u, v, w. The second part makes it possible to diagnose an anomaly in the control of a high-side transistor 12.

For these two parts, the first diagnostic procedure starts with a first step of initially configuring the inverter which here consists in positioning the transistors 12, 13 in the passive state (i.e. open), with the exception of the transistors of one of the branches of the inverter which corresponds to a phase u, v, w referred to as the phase being tested. The three phases u, v, w will be tested in turn via three iterations of the method, each allowing one phase u, v, w to be tested. For example, in a first iteration, the first phase tested is phase u. While the transistors of the two other phases v, w are kept open, the transistors corresponding to phase u are then pulse-width modulation controlled with a low duty cycle, i.e. one much lower than 50% (for example 10%), for the first part of the diagnostic procedure, and with a high duty cycle, i.e. one much higher than 50% (for example 90%), for the second part of the diagnostic procedure.

In a second step of initially configuring the phase switches 7, these phase switches 7 are all open.

In a step of biasing the phases, the biasing module 5 controls the biasing circuit 4 so as to bias all of the phases u, v, w with a predetermined diagnostic voltage Vb. The diagnostic voltage Vb is, in this example, 50% of the supply voltage DCLink of the inverter 2.

In a voltage measurement step, the microcontroller acquires the voltage of each phase u, v, w by virtue of the voltage module 8.

In a comparison step, the voltage measurement of each phase u, v, w is compared with an expected resultant value, and The expected resultant value for each phase is different for the first part of the diagnostic procedure and for the second part of the diagnostic procedure.

For the first part of this second diagnostic procedure:
- the expected resultant value for the phase being tested is equal to the supply voltage DCLink multiplied by the low duty cycle;
- the expected resultant value for the other two phases is equal to the diagnostic voltage Vb.

The following faults may be identified in this first diagnostic part when the voltages measured on phases u, v, w do not correspond to the expected resultant values:
- a malfunction in low-side transistor control corresponding to the phase being tested is identified if the voltage measured on the phase being tested is higher than the supply voltage DCLink multiplied by the low duty cycle (potentially plus a safety threshold);
- a short circuit between the phase being tested and one of the other two phases is identified if the voltage measured on one of these two other phases is equal to the voltage measured on the phase being tested, i.e. equal to the supply voltage DCLink multiplied by the low duty cycle.

For example, if phase v is being tested:
- voltage values of Vb on phase u, of DCLink multiplied by the low duty cycle on phase v, and of Vb on phase w correspond to the expected resultant values and no fault is detected;
- voltage values of DCLink multiplied by the low duty cycle on phase u, of DCLink multiplied by the low duty cycle on phase v, and of Vb on phase w correspond to the identification of a short circuit between phases u and v;

voltage values of Vb on phase u, of DCLink multiplied by the low duty cycle on phase v, and of Vb on phase w correspond to the identification of a malfunction in the control of transistor 13v.

Three iterations of this first part of the diagnostic procedure allow each phase to be switched to the role of phase being tested, and thus allow the above malfunctions to be identified for all of the phases u, v, w.

For the second part of this second diagnostic procedure:

the expected resultant value for the phase being tested is equal to the supply voltage DCLink multiplied by the high duty cycle;

the expected resultant value for the other two phases is equal to the diagnostic voltage Vb.

The following fault may be identified in this second diagnostic part when the voltages measured on phases u, v, w do not correspond to the expected resultant values:

a malfunction in high-side transistor control corresponding to the phase being tested is identified if the voltage measured on the phase being tested is lower than the supply voltage DCLink multiplied by the high duty cycle (potentially minus a safety threshold).

For example, if phase v is being tested:

voltage values of Vb on phase u, of DCLink multiplied by the high duty cycle on phase v, and of Vb on phase w correspond to the expected resultant values and no fault is detected;

voltage values of Vb on phase u, of the supply voltage DCLink multiplied by the high duty cycle on phase v, and of Vb on phase w correspond to the identification of a malfunction in the control of transistor 12v.

Three iterations of this second part of the diagnostic procedure allow each phase to be switched to the role of phase being tested, and thus allow high-side transistor control malfunctions to be identified for all of the phases u, v, w.

On completion of this second diagnostic procedure, if the control of one or more transistors 12, 13 is identified as faulty, or if a short circuit between two phases is identified, the system raises a flag (in step E6 of FIG. 2) indicating what the malfunction is and which transistor is involved.

Following this second sequential diagnostic procedure, if no phase short circuit or faulty transistor control has been identified, a third sequential diagnostic procedure then takes place (step E4 of FIG. 2). This third diagnostic procedure aims to identify:

any short circuit between a phase and ground (this short circuit being located between the phase switch and the motor); and any short circuit between a phase and the power supply (this short circuit being located between the phase switch and the motor).

This third diagnostic procedure starts with a first step of initially configuring the inverter which consists here in deactivating the control of the power stage, that is to say all of the transistors 12, 13 are positioned in the passive state (i.e. open) for this third diagnostic procedure.

In a second step of initially configuring the phase switches 7, these phase switches 7 are all positioned and kept in the closed state in order to be able to diagnose the phases u, v, w between the phase switches and the motor.

In a step of biasing the phases, the biasing module 5 controls the biasing circuit 4 so as to bias all of the phases u, v, w with a predetermined diagnostic voltage Vb. The diagnostic voltage Vb is, in this example, 50% of the supply voltage DCLink of the inverter 2.

In a voltage measurement step, the microcontroller acquires the voltage of each phase u, v, w by virtue of the voltage module 8. In this step, an average of the three phase voltages is also calculated. The three measured voltages are added and the result is divided by three, which makes it possible to obtain a voltage value resulting from the counter-electromotive forces, and therefore independent of the variation in the counter-electromotive forces brought about by the rotation of the motor.

In a comparison step, the average of the three phase voltages is compared with an expected resultant value. In the present example, the expected resultant value is equal to the diagnostic voltage Vb.

Conversely, if the average of the three phase voltages is lower than the voltage Vb (potentially minus a safety threshold), or if the average of the three phase voltages is lower than 0 V plus a predetermined threshold, this means that a short circuit is present between at least one phase and ground. Similarly, if the average of the three phase voltages is higher than the voltage Vb (potentially plus a safety threshold), or if the average of the three phase voltages is higher than DCLink minus a predetermined threshold, this means that a short circuit is present between at least one phase and the supply voltage DCLink.

On completion of this third diagnostic procedure, if one or more phases, on the motor side, are identified as being shorted to ground or the supply voltage, the system raises a flag (in step E6 of FIG. 2) indicating that the malfunction is a short circuit in the phases of the motor.

Following this third sequential diagnostic procedure, if no short circuit has been identified on the motor phases, a fourth sequential diagnostic procedure then takes place (step E5a and E5b of FIG. 2). This fourth diagnostic procedure allows the identification of a malfunction relating to one or more open motor phases, that is to say the interruption of an electrical conductor between a phase switch and the corresponding motor winding.

There are two variants of this fourth diagnostic procedure depending on the electrical rotational speed. The electrical rotational speed corresponds to the rotational speed of the motor multiplied by a factor relating to the number of pairs of motor poles. For example, for a motor with four pole pairs, the ratio of the electrical rotational speed to the motor rotational speed is 4. The first variant is implemented in the case of an electrical rotational speed lower than 210 rad/s for example, and the second variant is implemented in the case of a high electrical rotational speed, for example higher than 210 rad/s. As a variant, the speed threshold for selecting the first variant or the second variant may be dynamically adjusted as a function, in particular, of the available supply voltage.

In its first variant (slow motor speed), the fourth diagnostic procedure starts with a first step of initially configuring the inverter which here consists in positioning the transistors 12, 13 in the passive state (i.e. open), with the exception of the transistors of one of the branches of the inverter which corresponds to a phase u, v, w referred to as the phase being tested. The three phases u, v, w will be tested in turn via three iterations of the method, each allowing one phase u, v, w to be tested. For example, in a first iteration, the first phase tested is phase u. While the transistors of the two other phases v, w are kept open, the transistors corresponding to phase u are then pulse-width modulation controlled in a way that is chosen to be preferably away from 50%, i.e. with either a high value (for example 80%) or a low value (for example 20%).

In a second step of initially configuring the phase switches 7, these phase switches 7 are all positioned and kept in the closed state.

In a step of biasing the phases, the biasing module 5 controls the biasing circuit 4 so as to bias all of the phases u, v, w with a predetermined diagnostic voltage Vb. The diagnostic voltage Vb is, in this example, 50% of the supply voltage DCLink of the inverter 2.

In a voltage measurement step, the microcontroller acquires the voltage of each phase u, v, w by virtue of the voltage module 8.

In a comparison step, the voltage measurement of each phase u, v, w is compared with an expected resultant value. The expected resultant value for the phase being tested is equal to the supply voltage DCLink multiplied by the duty cycle. The expected resultant value for the two other phases is equal to the preceding voltage (supply voltage DCLink multiplied by the duty cycle) plus the counter-electromotive force of the phase in question.

Conversely, if the phase being tested is interrupted at the level of the motor, the voltage measured on the phase being tested is equal to the supply voltage DCLink multiplied by the duty cycle while the voltage measured on the two other phases is equal to the diagnostic voltage Vb plus the counter-electromotive force of the phase in question.

For example, if phase u is being tested:
voltage values of: DCLink multiplied by the duty cycle on phase u; of DCLink multiplied by the duty cycle and plus the counter-electromotive force of phase v on phase v; and of DCLink multiplied by the duty cycle and plus the counter-electromotive force of phase w on phase w; correspond to the expected resultant values and no fault is detected;
voltage values of: DCLink multiplied by the duty cycle on phase u; of Vb plus the counter-electromotive force of phase v on phase v; and Vb plus the counter-electromotive force of phase w on phase w; correspond to the identification of a malfunction relating to the interruption of a conductor of phase u on the motor side.

The counter-electromotive force of each phase may be obtained, for example, through calculation. Specifically, the amplitude of the counter-electromotive force voltage brought about by the rotational speed of the motor is equal to the speed of the motor multiplied by the flux of the motor multiplied by the square root of 3. The speed of the motor is measured by the speed module. Alternatively, the counter-electromotive force of each phase may be estimated with a threshold value since this first variant is applied at low rotational speeds.

Three iterations of this first variant of the diagnostic procedure (slow motor speed) allow each phase to be switched to the role of phase being tested, and thus allow the above malfunction to identified for all of the phases u, v, w.

On completion of this first variant of the fourth diagnostic procedure, if one or more phases, on the motor side, are identified as being interrupted, the system raises a flag (in step E6 of FIG. 2) indicating that the malfunction is an interruption at the level of the phases of the motor and indicating the phase in question.

In its second variant (fast motor speed), the fourth diagnostic procedure starts with a first step of initially configuring the inverter which consists here in deactivating the control of the power stage, that is to say all of the transistors 12, 13 are positioned in the passive state (i.e. open) for this second variant of the fourth diagnostic procedure.

In a second step of initially configuring the phase switches 7, these phase switches 7 are all positioned and kept in the closed state.

In a step of biasing the phases, the biasing module 5 controls the biasing circuit 4 so as to bias all of the phases u, v, w with a predetermined diagnostic voltage Vb. The diagnostic voltage Vb is, in this example, 50% of the supply voltage DCLink of the inverter 2.

In a voltage measurement step, the microcontroller acquires the voltage of each phase u, v, w by virtue of the voltage module 8. In this example, a sampling of N voltage values (for example 20) takes place simultaneously on each phase. A sample "Phase u(n)" thus designates a voltage measurement taken on phase u at time n, the sample "Phase v(n)" designates the voltage measurement taken on phase v at the same time n, and the sample "Phase w(n)" designates the voltage measurement taken on phase w at the same time n. If, for example, a sampling of two voltage measurements is taken on the phases u, v, w (N=2), two groups of three voltage measurements will be available:

three measurements taken simultaneously (n=1): Phase u(1), Phase v(1), Phase w(1);

three measurements taken simultaneously (n=2): Phase u(2), Phase v(2), Phase w(2).

In a step of measuring the rotational speed of the motor, a sampling of N speed values takes place simultaneously with the voltage measurements of the preceding step. Each speed measurement sample, denoted MotSpdEl(n), therefore corresponds to a motor speed measurement taken simultaneously with the Phase u(n), Phase v(n), and Phase w(n) voltage samples.

In a comparison step, the voltage measurement of each phase u, v, w is compared with an expected resultant value. This comparison step implements a comparison between a representative voltage Vdiag determined for each phase u, v, w and a threshold voltage Vseuil determined as indicated below. The principle is that the expected resultant values are:

for phase u: Vb+counter-electromotive force of phase u;

for phase v: Vb+counter-electromotive force of phase v;

for phase w: Vb+counter-electromotive force of phase w;

the sum of the counter-electromotive force of phase u, of the counter-electromotive force of phase v, and of the counter-electromotive force of phase w, is zero.

Thus, if according to the example above, phase v is being tested and if this phase is interrupted at the level of the motor, then the voltage value measured on this phase v will be substantially equal to the diagnostic voltage Vb and the sum of the counter-electromotive force of phase u and of the counter-electromotive force of phase w will be zero.

In practice, the representative voltage Vdiag for a phase u, v, w is preferably calculated for each measured voltage sample n. The representative voltage Vdiag for one of the phases (called the phase being tested) and for a voltage measurement sample "n" is equal to the absolute value of the average of the voltages n of all of the phases u, v, w minus the average of the voltages n of the two phases which are not being tested. The calculation of this representative voltage Vdiag is written as:

$$VdiagPhX(n) = \left| \left( \frac{VphX(n) + VphY(n) + VphZ(n)}{3} - \frac{VphY(n) + VphZ(n)}{2} \right) \right|$$ [Math 1]

This value VdiagPhX(n) is therefore calculated for each phase u, v, w in three iterations where the phases u, v, w are sequentially designated as the phase being tested.

In addition, a threshold voltage is calculated for each motor speed measurement sample "n", according to the formula:

Vseuil(n)=VseuilMin+SpdRatio×max(0,|(MotSpdEl(n))|−MotSpdElMin) [Math 2]

In the preceding formula:
VseuilMin is a fixed safety threshold, in the present example set at 0.3 V;
SpdRatio is a ratio applied to the motor speed to increase the threshold voltage. In this example, SpdRatio is set at 0.0015 V/(rad/s);
MotSpdEl(n) is the motor speed measurement for sample n;
MotSpdElmin is the minimum speed for which this second variant of the fourth diagnostic procedure may be used. This value here is 210 rad/s.

The comparison step is carried out by comparing, for each phase u, v, w, the value VdiagPhX(n) and the corresponding value Vseuil(n). When VdiagPhX(n) is lower than Vseuil(n), an error is qualified for sample n, and for the phase u, v, w in question. When, for a given phase u, v, w, more than 80% of the samples n lead to a qualified error, the failure is identified, i.e. an interruption in the continuity of the motor phase of the phase in question. This level of 80% corresponds to an identification threshold which may be adjusted.

On completion of this second variant of the fourth diagnostic procedure, if a phase u, v, w is identified as interrupted at the level of the motor, the system raises a flag (in step E6 of FIG. 2) by activating a signal indicating which phase is interrupted.

Figure 4:
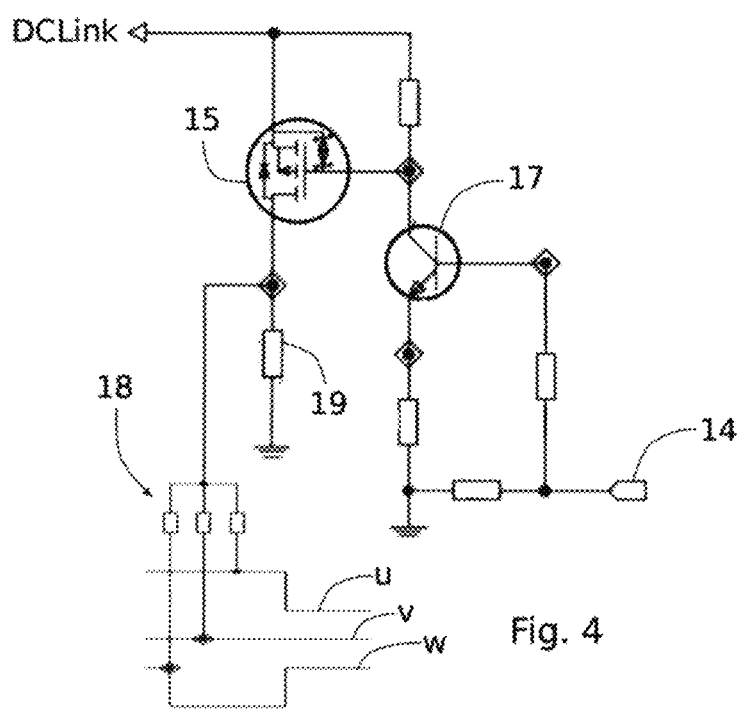
FIG. 4 illustrates the circuit for biasing the phases of the inverter-motor assembly of FIGS. 1 and 3.

FIG. 4 illustrates one example of a biasing module 5 designed to produce a diagnostic voltage Vb which is equal to 50% of the supply voltage DCLink for each of the phases u, v, w. This central value allows for maximum deviation from both the zero ground potential and the supply potential, so that high-speed diagnostics may be performed despite the counter-electromotive force voltages brought about by the speed of the motor.

This voltage divider assembly comprises a logic signal input 14 connected to the microcontroller which activates or deactivates the biasing of the phases. The logic signal input 14 drives a MOS transistor 15 placed between the supply voltage DCLink and ground, via a bipolar transistor 17. When the MOS transistor 15 is controlled (with a view to biasing the phases in the phase-biasing steps), the motor phases are connected to the supply voltage DCLink by pull-up resistors 18. When the MOS transistor 15 is not controlled, the phases u, v, w are connected to ground via the pull-down resistor 19.

High resistance values are used for the resistors 18, 19 so that the assembly does not interfere with the driving of the motor phases by the power stage when the latter is active.

Any other electronic assembly allowing the diagnostic voltage Vb to be applied to the phases u, v, w may alternatively be used as a biasing module 5.

Other variant embodiments of the method for identifying a malfunction may be implemented without departing from the scope of the invention. For example, only some of the sequential diagnostic procedures described may be carried out to constitute a method for identifying a malfunction.

The invention claimed is:

1. A method for identifying a malfunction in a multiphase inverter-motor assembly comprising an electric motor and an inverter having power switches distributed across branches, each phase of the electric motor being connected to a branch of the inverter by a phase switch, the method comprising a plurality of sequential diagnostic procedures each comprising:
initially configuring the inverter in which a control choice is made for each branch of the inverter, this choice being made from among the group consisting of: open-mode fixed control of the power switches; pulse-width modulation control according to a predetermined diagnostic duty cycle of the power switches;
initially configuring the phase switches in which a choice of state is made for each phase switch, this choice being made between a closed state and an open state;
biasing the phases in which a predetermined diagnostic voltage is applied to each of the branches of the inverter;
a voltage measurement step in which the voltage of each phase measured;
a comparison step in which the voltage measurement of each phase is compared with an expected resultant value, and
identifying a malfunction when the voltage measurement of a phase differs from the expected resultant value, and said method further comprising:
a first sequential diagnostic procedure in which:
all of the power switches are open-mode controlled in the step of initially configuring the inverter;
all of the phase switches are positioned in the open state in the step of initially configuring the phase switches;
in the step of biasing the phases the predetermined diagnostic voltage is substantially 50% of the supply voltage (DCLink) of the inverter;
in the comparison step, the expected resultant value for each phase is substantially equal to the predetermined diagnostic voltage;
in the step of identifying a malfunction, when the voltage measurement of a phase is substantially equal to the supply voltage of the inverter, a short circuit is identified on the power switch on the high side of the corresponding phase,
a second sequential diagnostic procedure in which:
in the step of initially configuring the inverter, all of the power switches are open-mode controlled with the exception of the power switches corresponding to a phase being tested which are pulse-width modulation controlled according to a predetermined diagnostic duty cycle;
all of the phase switches are positioned in the open state in the step of initially configuring the phase switches;
in the step of biasing the phases, the predetermined diagnostic voltage is substantially 50% of the supply voltage of the inverter;
in the comparison step, the expected resultant value for the phase being tested is a value substantially equal to the supply voltage of the inverter multiplied by the predetermined diagnostic duty cycle, and the expected resultant value for the other phases is substantially equal to the predetermined diagnostic voltage, a third sequential diagnostic procedure in which:
  in the step of initially configuring the inverter, all of the power switches are open-mode controlled;
  all of the phase switches are positioned in the closed state in the step of initially configuring the phase switches;
  in the step of biasing the phases, the predetermined diagnostic voltage is substantially 50% of the supply voltage of the inverter;
  in the voltage measurement step, the average of the voltages of all of the phases is determined;
  in the comparison step, the expected resultant value for the average of the voltages of all of the phases is substantially equal to the predetermined diagnostic voltage;
  in the step of identifying a malfunction, when the average of the voltages of all of the phases is lower than the predetermined diagnostic voltage, a short circuit is identified between at least one phase and ground, this short circuit being located between the phase switches and the motor.

2. The method as claimed in claim 1, wherein, in the step of biasing the phases, the predetermined diagnostic voltage is substantially 50% of the supply voltage of the inverter.

3. The method as claimed in claim 2, wherein the voltage measurement step is carried out by determining the average of a plurality of voltage measurement samples taken for each phase.

4. The method as claimed in claim 1, wherein the voltage measurement step is carried out by determining the average of a plurality of voltage measurement samples taken for each phase.

5. The method as claimed in claim 1, wherein, in the step of identifying a malfunction, when the voltage measurement of a phase is substantially equal to zero, a short circuit is identified on the low-side power switch of the corresponding phase.

6. The method as claimed in claim 1, wherein, according to a first part of the second sequential diagnostic procedure:
  in the step of initially configuring the inverter, the predetermined diagnostic duty cycle is much lower than 50%;
  in the step of identifying a malfunction, when the voltage measurement of a phase which is not being tested is substantially equal to the voltage of another phase which is not being tested, a short circuit is identified between these two phases.

7. The method as claimed in claim 6, wherein, according to a second part of the second sequential diagnostic procedure:
  in the step of initially configuring the inverter, the predetermined diagnostic duty cycle is much higher than 50%;
  in the step of identifying a malfunction, when the voltage measurement of the phase being tested is lower than the supply voltage multiplied by the predetermined diagnostic duty cycle, a malfunction is identified in the control of the high-side power switch of the phase being tested.

8. The method as claimed in claim 1, wherein, when the voltage measurement of the phase which is being tested is higher than the supply voltage multiplied by the predetermined diagnostic duty cycle, a malfunction is identified in the control of the low-side power switch of the phase being tested.

9. The method as claimed in claim 8, wherein, according to a second part of the second sequential diagnostic procedure:
  in the step of initially configuring the inverter, the predetermined diagnostic duty cycle is much higher than 50%;
  in the step of identifying a malfunction, when the voltage measurement of the phase being tested is lower than the supply voltage multiplied by the predetermined diagnostic duty cycle, a malfunction is identified in the control of the high-side power switch of the phase being tested.

10. The method as claimed in claim 1, wherein, in the step of identifying a malfunction, when the average of the voltages of all of the phases is higher than the predetermined diagnostic voltage, a short circuit is identified between at least one phase and the supply voltage of the inverter, this short circuit being located between the phase switches and the motor.

11. The method as claimed in claim 1, further comprising a first variant of a fourth sequential diagnostic procedure in which:
  in the step of initially configuring the inverter, all of the power switches are open-mode controlled with the exception of the power switches corresponding to a phase being tested which are pulse-width modulation controlled according to a predetermined diagnostic duty cycle;
  all of the phase switches are positioned in the closed state in the step of initially configuring the phase switches;
  in the step of biasing the phases, the predetermined diagnostic voltage is substantially 50% of the supply voltage of the inverter;
  in the comparison step, the expected resultant value for the phase being tested is substantially equal to the value of the supply voltage of the inverter multiplied by the predetermined diagnostic duty cycle, and the expected resultant value for the other phases is substantially equal to the voltage of the phase being tested plus the counter-electromotive force of the phase in question;
  in the step of identifying a malfunction, when the voltage of the phase being tested is substantially equal to the value of the supply voltage of the inverter multiplied by the predetermined diagnostic duty cycle, and when the voltages of the other phases are substantially equal to the predetermined diagnostic voltage plus the counter-electromotive force of the phase in question, an interruption is identified on the phase being tested, between the phase switches and the motor.

12. The method as claimed in claim 11, further comprising a second variant of the fourth sequential diagnostic procedure in which:
  in the step of initially configuring the inverter, all of the power switches are open-mode controlled;
  all of the phase switches are positioned in the closed state in the step of initially configuring the phase switches;
  in the step of biasing the phases, the predetermined diagnostic voltage is substantially 50% of the supply voltage of the inverter;
  in the comparison step, the expected resultant value for each phase is substantially equal to the predetermined diagnostic voltage plus the counter-electromotive force of the phase in question, the addition of the counter-electromotive forces of all of the phases being equal to zero;
  in the step of identifying a malfunction, when the voltage of a first phase is substantially equal to the predetermined diagnostic voltage and the sum of the counter-electromotive forces of the other phases is equal to zero, an interruption is identified on this first phase, between the phase switches and the motor.

13. The method as claimed in claim 12, further comprising a second variant of the fourth sequential diagnostic procedure in which:
   in the step of initially configuring the inverter, all of the power switches are open-mode controlled;
   all of the phase switches are positioned in the closed state in the step of initially configuring the phase switches;
   in the step of biasing the phases, the predetermined diagnostic voltage is substantially 50% of the supply voltage of the inverter;
   in the measurement step, the voltage measurements are carried out according to a sampling comprising a predetermined number of measurements;
   in the comparison step, the expected resultant value for each phase is substantially equal to the predetermined diagnostic voltage plus the counter-electromotive force of the phase in question, the addition of the counter-electromotive forces of all of the phases being equal to zero;
   in the step of identifying a malfunction, when the voltage of a first phase is substantially equal to the predetermined diagnostic voltage and the sum of the counter-electromotive forces of the other phases is equal to zero, an error is qualified for this first phase;
   when the number of qualified errors exceeds an identification threshold, an interruption is identified on this first phase, between the phase switches and the motor.

14. The method as claimed in claim 13, wherein the first variant of the fourth sequential diagnostic procedure is implemented for an electrical rotational speed below approximately 200 rad/s and the second variant of the fourth sequential diagnostic procedure is implemented for an electrical rotational speed above approximately 200 rad/s.

15. The method as claimed in claim 12, wherein the first variant of the fourth sequential diagnostic procedure is implemented for an electrical rotational speed below approximately 200 rad/s and the second variant of the fourth sequential diagnostic procedure is implemented for an electrical rotational speed above approximately 200 rad/s.

* * * * *

UNITED STATES PATENT AND TRADEMARK OFFICE
CERTIFICATE OF CORRECTION

PATENT NO. : 12,021,470 B2
APPLICATION NO. : 17/797242
DATED : June 25, 2024
INVENTOR(S) : Rodolphe Jaumouillé and Michel Parette Page 1 of 1

It is certified that error appears in the above-identified patent and that said Letters Patent is hereby corrected as shown below:

In the Claims

In Column 16, Line 38 Claim 1: delete "phases" and insert -- phases, --.

In Column 16, Line 40 Claim 1: after "voltage" delete "(DCLink)".

Signed and Sealed this
Eleventh Day of February, 2025

Coke Morgan Stewart
*Acting Director of the United States Patent and Trademark Office*